United States Patent [19]

Hamstra

[11] 4,052,624

[45] Oct. 4, 1977

[54] RAMP AND PEDESTAL CONTROL CIRCUIT

[75] Inventor: David C. Hamstra, Clinton, Iowa

[73] Assignee: General Electric Company, Fort Wayne, Ind.

[21] Appl. No.: 674,381

[22] Filed: Apr. 7, 1976

[51] Int. Cl.² ............................................ H03K 17/72
[52] U.S. Cl. ................................ 307/252 B; 307/318; 323/22 SC
[58] Field of Search ........... 307/252 BN, 252 W, 318; 323/22 SC, 39

[56] References Cited

U.S. PATENT DOCUMENTS

| | | | |
|---|---|---|---|
| 3,346,874 | 10/1967 | Howell | 323/39 X |
| 3,403,315 | 9/1968 | Maynard | 318/227 |
| 3,421,027 | 1/1969 | Maynard et al. | 307/293 |
| 3,495,154 | 2/1970 | Dosch et al. | 318/332 |
| 3,594,591 | 7/1971 | Laupman | 307/252 B |

OTHER PUBLICATIONS

General Electric SCR Manual, Fifth Edition, 1972, pp. 256–257 and 332.

*Primary Examiner*—John Zazworsky
*Attorney, Agent, or Firm*—Joseph E. Papin

[57] ABSTRACT

A ramp and pedestal phase control circuit for controlling electrical energy supplied from an alternating current source to a load. The circuit has a controllable alternating current switching device, and bilateral threshold means is provided for enabling the switching device to conduct current from the source to the load when the magnitude of the voltage across the threshold means exceeds a predetermined value. A first circuit rapidly increases the voltage across the threshold means to a value less than the predetermined value, and a second circuit more slowly further increases the voltage across the threshold means to the predetermined value so as to enable the switching device. The first and second circuits are effective on successive half cycles of the alternating current source to reverse the polarity of the voltage across the threshold means.

6 Claims, 4 Drawing Figures

RAMP AND PEDESTAL CONTROL CIRCUIT

BACKGROUND OF THE INVENTION

This invention relates generally to control circuits and in particular to a ramp and pedestal phase control circuit.

In the past, various phase control circuits were known and widely used for controlling a supply of electrical energy to a load. One such past phase control circuit is of a half wave variety, as illustrated by the Dosch et al. U.S. Pat. No. 3,495,154, wherein a thyristor is gated part way through each positive half cycle of the source to supply portions of each successive positive half cycle to the load. With such half wave phase control circuitry, a substantial direct current component is delivered to the load. Another past phase control circuit is of the so-called Diac-Triac scheme, as illustrated in U.S. Pat. Nos. 3,403,315; 3,421,027; and 3,594,591. Such past Diac-Triac type circuits are also shown in the General Electric SCR Manual, Fourth Edition, pages 187-191. Briefly, in such Diac-Triac type circuits, a Triac or other type of controllable alternating current switching device was gated or enabled into its conducting state to effect the supply energy to a load during positive and negative half cycles of an alternating current source, and such gating of the Triac was effected by a Diac or other bilateral threshold device which became conductive when the voltage across a capacitor associated therewith exceeded a predetermined value regardless of polarity. This capacitor was charged during each half cycle through a variable resistance, and variations in such resistance determine the charging rate of such capacitor and, therefore, the particular time during each half cycle at which the Diac enabled the Triac. It is believed that one of the disadvantageous or undesirable features of these past Diac-Triac type phase control circuits was that they suffered from gain or sensitivity limitations. For example, when the aforementioned variable resistor which determined the time constant for capacitor charging was constituted by a photoconductor or a thermistor, inadequate amounts of phase control may have been experienced. A thermistor, for example, may typically have 3 to 4 per cent resistance change per degree centigrade, and such a change frequently was not sufficient to change the phase angle for firing the Triac enough to compensate for the temperature change experienced.

Still another of the past schemes for improving the gain or sensitivity of a phase control circuit is the so-called ramp and pedestal control circuit, as described in the aforementioned General Electric SCR Manual pages 191-196. For instance, the past known ramp and pedestal phase control circuits typically employed a relaxation oscillator type circuit which was energized by a bridge or other rectifying scheme to appropriately enable a unijunction transistor, and conduction through such unijunction transistor, in turn, was employed to gate a solid state switching device. Typically, a full wave rectified sine wave is clipped by a zener diode, and this clipped series of somewhat rectangular pulses was applied to the unijunction transistor and also was employed for charging a capacitor associated therewith. Of course, the voltage of the capacitor was employed to enable the unijunction transistor. The capacitor voltage was initially rapidly increased to a pedestal level, and thereafter such capacitor voltage was more slowly increased along a ramp until conduction by the unijunction transistor occurred. A resistive control element, e.g., a thermistor, varied the pedestal height so as to provide the sensitivity or gain required. The past known ramp and pedestal control circuits provided the desired sensitivity, but it is believed that at least one disadvantageous or undesirable feature thereof is that they were relatively complex and costly.

SUMMARY OF THE INVENTION

Among the several objects of the present invention may be noted the provision of a ramp and pedestal phase control circuit which overcomes the above discussed disadvantageous or undesirable features, as well as others, of the past control circuits; the provision of such ramp and pedestal phase control circuit which is simplistic and has a wide range of control or higher gain for the circuit; the provision of such ramp and pedestal phase control circuit of the variable height pedestal and ramp type wherein both negative going and positive going ramp and pedestal portions are employed; and the provision of such ramp and pedestal phase control circuit which is simplistic in design, economically manufactured, and easily assembled. These as well as other objects and advantageous features will be in part apparent and in part pointed out hereinafter.

In general, a ramp and pedestal phase control circuit is provided in one form of the invention for controlling electrical energy supplied from an alternating current source to a load. The circuit has a controllable alternating current switching device, and bilateral threshold means is provided for enabling the switching device to conduct current from the source to the load when the magnitude of the voltage across the threshold means exceeds a predetermined value. A first circuit rapidly increases the voltage across the threshold means to a first value less than the predetermined value, and a second circuit more slowly further increases the voltage across the threshold means to the predetermined value so as to enable the switching device. The first and second circuits are effective on successive half cycles of the alternating current source to reverse the polarity of the voltage across the threshold means.

Also in general and in one form of the invention, a ramp and pedestal phase control circuit is provided for controlling electrical energy supplied from an alternating current source to a load. This circuit has a controllable alternating current switching device and an electrical energy storage device, limiting means for clipping both the positive and negative peaks from the alternating current source voltage provides a clipped alternating current voltage as an output, and threshold means is coupled to the switching device for enabling the switching device when a voltage applied to the threshold means exceeds a predetermined value. First circuit means is coupled to the limiting means output for rapidly increasing the voltage applied to the threshold means to a value less than the predetermined value, and second circuit means is coupled to the limiting means output for more slowly further increasing the voltage applied to the threshold means to the predetermined value so as to enable the switching device.

Further in general, a ramp and pedestal phase control circuit in one form of the invention provides a threshold voltage to enable a supply of electrical energy from an alternating current source to a load. In this circuit, a first pair of electrical circuit elements are connected in series, a second pair of electrical circuit elements are also connected in series, the first and second pairs being connected in parallel to a source of alternating current. Means is provided for connecting the series junction of the first pair and the series junction of the second pair to conduct current from one junction to the other junction only when the potential difference between the junctions exceeds a predetermined value greater than zero.

BRIEF DESCRIPTION OF THE DRAWING

Corresponding reference characters indicate corresponding parts throughout the several views of the drawings.

The exemplifications set out herein illustrate the preferred embodiments of the invention in one form thereof, and such exemplifications are not to be construed as limiting the scope of the disclosure or the invention in any manner.

DETAILED DESCRIPTION OF THE PREFERRED EMBODIMENT

Figure 1:
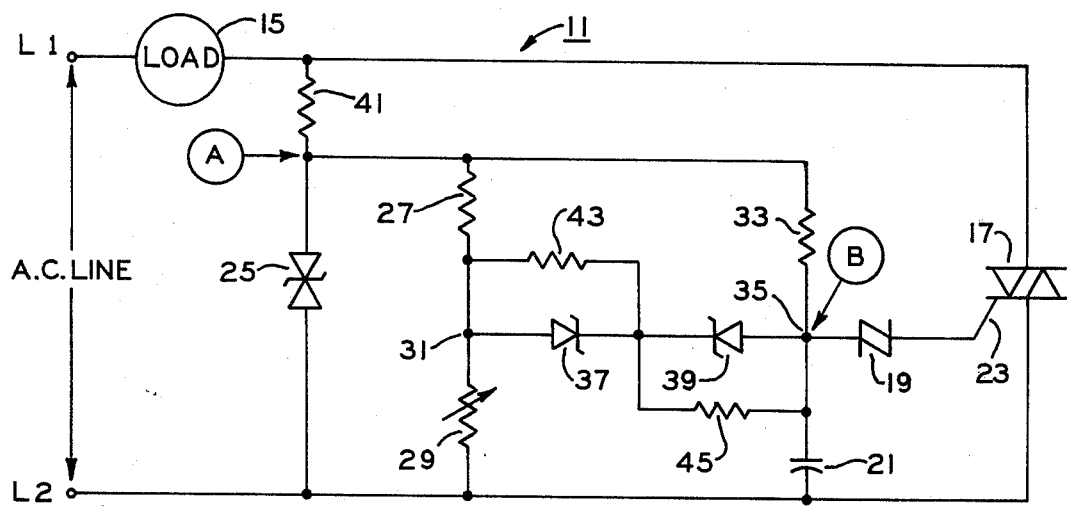
FIG. 1 is a schematic representation of a bilateral ramp and pedestal phase control circuit in one form of the invention.
Figure 2A:
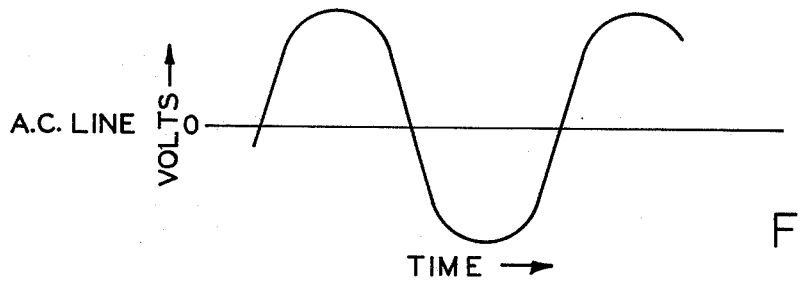
FIGS. 2A, 2B and 2C respectively illustrate voltage wave forms at various points in the circuit of FIG. 1.
Figure 2B:
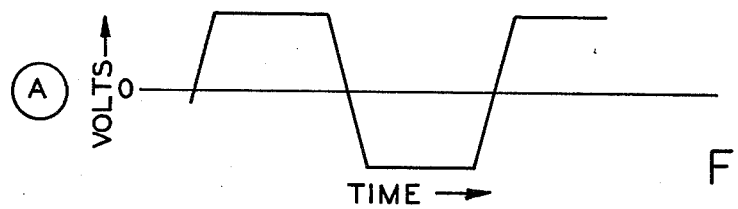

Referring now to the drawings in detail and in particular to FIG. 1, a ramp and pedestal phase control circuit is indicated generally at 11, and electrical energy or power is supplied thereto from an alternating current source which is indicated generally by power or line terminals L1, L2. The power supplied from the alternating current source has a wave form illustrated in FIG. 2A. The power occurring across line terminals L1, L2 is supplied to a load 15 when a solid state, gated or controllable alternating current switching device, such as a Triac 17 for instance, is enabled to its conductive state so as to conduct. Triac 17 is enabled to its conductive state whenever a voltage which occurs across a bilateral trigger or threshold device, such as a Diac 19 for instance, exceeds a predetermined value. In practice, this predetermined or threshold value of the voltage which causes Diac 19 to conduct is generally the same as the voltage occurring across a capacitor 21 since the voltage drop between a gate 23 of Triac 17 and a main electrode thereof is relatively small. Of course, the voltage across capacitor 21 which is effective to enable Triac 17 may be of either polarity, and typically such a threshold voltage is reached once during each half cycle of the alternating current supply voltage. This threshold voltage may be obtained from the supply voltage occurring across line terminals L1, L2 by clipping or limiting the positive and negative peaks from the supply voltage, as illustrated in FIG. 2B, as the voltage across a clipping or limiting means 25. Clipping or limiting means 25 may be constituted by a pair of oppositely poled series connected zener diodes, or if desired, other devices, such as a metal oxide varistor for instance, may also be utilized in circuit 11 within the scope of the invention.

Figure 2C:
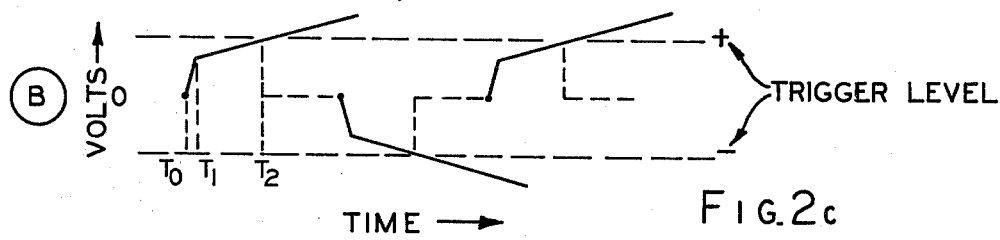

The clipped, alternating current voltage across limiting means or voltage regulator 25, as illustrated in FIG. 2B, is supplied to two circuits incorporated in circuit 11. For instance, in one of such two circuits, a pair of series connected circuit elements are constituted by resistive elements, such as resistors 27, 29, which are series connected at a circuit junction 31. In the other of the aforementioned two circuits, a second pair of series connected circuit elements are constituted by a resistive element, such as a resistor 33, and a reactance element, such as capacitor 21, which are series connected at a circuit junction 35. Means, such as a pair of oppositely poled zener diodes 37, 39 for instance, is provided for interconnecting junctions 31, 35 so as to conduct current between the aforementioned two circuits incorporated in circuit 11 only upon the occurrence of a potential difference therebetween or between the junctions exceeds the predetermined value greater than zero. The sinusoidal voltage wave form appearing across line terminals L1, L2, as illustrated in FIG. 2A, is converted to the clipped voltage wave form, as illustrated in FIG. 2B, by a voltage divider circuit generally constituted by a resistor 41 and voltage regulator 25. This clipped voltage wave form across voltage regulator 25 is also applied to resistors 27, 29 and also to capacitor 21 and resistor 33. The voltage wave form across resistor 29, which is the same as the potential at junction 31 with respect to a selected reference level, such as line terminal L2 for instance, has the same wave form as that across voltage regulator 25 and is reduced in magnitude in accordance with voltage divider circuit generally constituted by resistors 27, 29. Thus, the voltage at junction 31 rapidly rises to the predetermined or fixed value, which exceeds the breakdown voltage for zener diode 39, so as to rapidly charge capacitor 21. That is to say, during an initial portion of a positive half cycle of the line voltage, capacitor 21 is being charged through resistor 27 and zener diodes 37, 39 as well as through resistor 33, and the charge on capacitor 21 rapidly increases. In FIG. 2C, the voltage wave form across capacitor 21 is illustrated, and the events thus far described are represented by the portion of the wave form between $T_0$ and $T_1$. At $T_1$, the potential difference between junctions 31 and 35 is no longer greater than the zener voltage, and conduction through the oppositely poled zener diodes 37, 39 ceases; however, capacitor 21 continues to charge by way of resistor 33 but now has a much greater time constant, as illustrated by the interval between $T_1$ and $T_2$ in FIG. 2C. At $T_2$, the voltage across capacitor 21 is generally the threshold voltage of Diac 19, and the Diac conducts so as to enable Triac 17 thereby to supply energy to load 15 and to effect the discharge of capacitor 21. During negative half cycles of the line voltage, a similar sequence of events occurs.

Zener diodes 37, 39 are effective to allow the voltage across capacitor 21 to exceed the voltage across resistor 29. Of course, should the voltage across capacitor 21 exceed the voltage across resistor 29 by the zener breakdown voltage of zener diode 27, capacitor 21 would charge no further; however, the components of circuit 11 are selected so that Diac 19 triggers before this occurs.

Characteristic variations between individual zener diodes 37, 39 can give rise to a net direct current component of electrical energy supplied to load 15, and balancing resistors such as 43, 45 may be employed having resistance values selected to compensate for such characteristic variations.

Resistor 33 is substantially larger in ohmic value than resistor 27 thus accounting for the large or acute slope of the line between $T_0$ and $T_1$, as shown in FIG. 2C, when both of the resistors are contributing charging current to capacitor 21, and the much smaller or obtuse slope between $T_1$ and $T_2$ defines a lower charging rate when only resistor 33 is contributing charging current to the capacitor. Of course, a change in the value of capacitor 21 or resistors 27, 29, 33 will change the wave form depicted in FIG. 2C. Changes in the values of either resistor 33 or capacitor 21 affect primarily the ramp portion of the wave form in FIG. 2C, that is, that portion between $T_1$ and $T_2$. Changes in resistors 27, 29 are effective to raise or lower the level of the pedestal, that is, the voltage level at $T_1$, and it may be noted that minor changes in that pedestal height yield much greater control over the triggering time thus providing the gain desired. Since resistor 27 carries charging current for capacitor 21 and may be heated somewhat thereby, resistor 29 is preferably selected as the heat sensing resistor. Changes in the resistance of this heat sensitive resistance 29 cause corresponding substantial changes in the phase angle at which Triac 17 is enabled. Of course, it is contemplated that resistor 29 may be a photosensitive device or a temperature sensitive device as well as a simple manually controllable variable resistance within the scope of the invention.

Numerous modifications will suggest themselves to those having ordinary skill in the art. For example, while the reactive element in the second series circuit has been illustrated as capacitor 21, this capacitor could be replaced by a resistance, and an inductor of suitable value may be substituted for resistor 33 to provide a control circuit having substantially the same wave form as illustrated in FIG. 2C.

The following list illustrates exemplary component values which may be employed for the electronic components of circuit 11:

| Component | Values |
| --- | --- |
| 33, 43, 45 | 100,000 ohms |
| 27, 29 | 50,000 ohms |
| 41 | 5,000 ohms |
| 37, 39 | 8.5 v. |
| 25 | 40 v. |
| 21 | 0.1 mf. |
| 19 | 9 v. |
| 17 | 6–50 amp. |

From the foregoing, it is now apparent that a novel ramp and pedestal phase control circuit 11 is provided meeting the objects and advantageous features set out herein, as well as others, and it is contemplated that changes as to the connections and components of such circuit may be made by those having ordinary skill in the art without departing from the spirit of the invention or the scope thereof as set out by the claims which follow.

What I claim as new and desire to secure by Letters Patent of the United States is:

1. A ramp and pedestal phase control circuit for controlling electrical energy supplied from an alternating current source to a load comprising:
   a controllable alternating current switching device;
   bilateral threshold means for enabling said switching device to conduct current from the source to the load when the magnitude of the voltage across said bilateral threshold means exceeds a predetermined value;
   a first circuit for rapidly increasing the voltage across said bilateral threshold means to a value less than the predetermined value;
   a second circuit for more slowly further increasing the voltage across said bilateral threshold means at least to the predetermined value so as to enable said switching device, said first and second circuits being effective on successive half cycles of the alternating current source to reverse the polarity of the voltage across said bilateral threshold means; and
   means for minimizing the net direct current component of electrical energy supplied to the load, one of said first and second circuits including a resistive circuit element and a reactive circuit element in series relation and having a first circuit junction therebetween and the other of said first and second circuits including a pair of resistive circuit elements coupled in series relation and having a second circuit junction therebetween, said minimizing means comprising a pair of balancing resistors connected in series relation between said first and second circuit junctions.

2. A control circuit as set forth in claim 1 wherein at least one of said resistive circuit elements is variable.

3. A control circuit for providing a threshold voltage to enable the supply of electrical energy from an alternating current source to a load comprising:
   a first pair of electrical circuit elements connected in series;
   a second pair of electrical circuit elements connected in series, said first and second electrical circuit element pairs being connected in parallel to a source of alternating current; and
   means for interconnecting the series junction of said first electrical circuit element pair and the series junction of said second electrical circuit element pair to conduct current from one of the series junctions to the other thereof, said interconnecting means comprising a pair of oppositely poled series connected zener diodes and a pair of balancing resistors each connected in parallel with a corresponding zener diode and having a resistance value selected to compensate for variations between the zener diodes for minimizing the net direct current component of electrical energy supplied to the load.

4. A control circuit as set forth in claim 3 further comprising means coupled with said first and second electrical circuit element pairs for clipping both positive and negative peaks of the supplied voltage from the alternating current source so as to provide a clipped alternating current as an output to said first and second electrical circuit element pairs.

5. A control circuit as set forth in claim 3 wherein at least one of said electrical circuit elements in said first pair thereof is variable and one of said electrical circuit elements in said second pair thereof comprises a capacitor, the threshold voltage being substantially the voltage across said capacitor.

6. A ramp and pedestal phase control circuit for controlling electrical energy supplied from an alternating current source to a load comprising:
   a controllable alternating current switching device;
   an electrical energy storage device;
   means for clipping both positive and negative peaks from the alternating current voltage to provide a clipped alternating current voltage as an output;
   threshold means coupled to said switching device for enabling it when a voltage applied to said threshold means exceeds a predetermined value;
   means coupled to the output of said clipping means for rapidly increasing the voltage applied to said threshold means to a first value less than the predetermined value and including a pair of circuit elements connected in series;

means coupled to the output of said clippings means for more slowly further increasing the voltage applied to said threshold means to at least the predetermined value so as to enable said switching device and including another pair of circuit elements connected in series;

means for respectively interconnecting the series junction of said first named circuit element pair and said another circuit element pair so as to conduct current only when a potential difference therebetween exceeds a predetermined value greater than zero, said first name circuit element pair and said another circuit element pair being connected in parallel to the output of said clipping means, and said interconnecting means comprising a pair of oppositely poled series connected zener diodes; and at least one balancing resistor connected in parallel with a corresponding zener diode and having a resistance value selected to compensate for variations between the zener diodes for minimizing the direct current component of the electrical energy supplied to the load.

* * * * *